US006445109B2

(12) United States Patent
Perçin et al.

(10) Patent No.: US 6,445,109 B2
(45) Date of Patent: Sep. 3, 2002

(54) MICROMACHINED TWO DIMENSIONAL ARRAY OF PIEZOELECTRICALLY ACTUATED FLEXTENSIONAL TRANSDUCERS

(75) Inventors: Gökhan Perçin, Los Altos; Butrus Thomas Khuri-Yakub, Palo Alto, both of CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/795,812

(22) Filed: Feb. 27, 2001

Related U.S. Application Data

(63) Continuation of application No. 09/098,011, filed on Jun. 15, 1998, now Pat. No. 6,291,927, which is a continuation-in-part of application No. 08/530,919, filed on Sep. 20, 1995, now Pat. No. 5,828,394.

(51) Int. Cl.$^{7}$ ............................................ H01L 41/08
(52) U.S. Cl. ..................................... 310/324; 310/331
(58) Field of Search ................................ 310/330, 331, 310/332, 324, 328, 321

(56) References Cited

U.S. PATENT DOCUMENTS

| | | | | |
|---|---|---|---|---|
| 4,032,929 A | * | 6/1977 | Fischbeck et al. | 310/328 X |
| 4,115,789 A | | 9/1978 | Fischbeck | |
| 4,533,082 A | * | 8/1985 | Maehara et al. | 239/102 |
| 4,605,167 A | | 8/1986 | Maehara | |
| 4,702,418 A | | 10/1987 | Carter et al. | |
| 4,751,419 A | | 6/1988 | Takahata | |
| 4,783,821 A | | 11/1988 | Muller et al. | |
| 4,871,938 A | | 10/1989 | Elings et al. | |
| 5,034,645 A | | 7/1991 | Woodruff et al. | |
| 5,160,870 A | * | 11/1992 | Carson et al. | 310/324 X |
| 5,173,605 A | | 12/1992 | Hayes et al. | |
| 5,487,378 A | | 1/1996 | Robertson et al. | |
| 5,594,292 A | | 1/1997 | Takeuchi et al. | |
| 5,828,394 A | * | 10/1998 | Khuri-Yakub et al. | 310/328 X |
| 6,291,927 B1 | * | 9/2001 | Percin et al. | 310/324 |

FOREIGN PATENT DOCUMENTS

| | | | | |
|---|---|---|---|---|
| EP | 0077636 A | | 4/1983 | |
| EP | 0542723 A | | 5/1993 | |
| JP | 59073963 | * | 4/1984 | 310/324 |
| JP | 60068071 | | 4/1985 | |
| JP | 62030048 | | 2/1987 | |
| JP | 62088408 | | 4/1987 | |
| WO | WO92/11050 A | | 7/1992 | |
| WO | WO93/01404 A | | 1/1993 | |
| WO | 10910 | * | 6/1993 | 310/324 |
| WO | WO93/10910 A | | 6/1993 | |

OTHER PUBLICATIONS

Bernstein, J. et al., "Micromachined Ferroelectric Transducers For Acoustic Imaging," Int'l Conference on Solid State Sensors and Actuators, Chicago, Jun. 16–19, 1997, pp. 421–424.

Percin, G. et al., "Piezoelectrically Actuated Droplet Ejector," Rev. Sci. Instrum. 68(12), Dec. 1997, pp. 4561–4563.

Percin, G. et al., "Micromachined Two–Dimensional Array Piezoelectrically Actuated Transducers," Applied Physics Letters, vol. 72., Num. 11, Mar. 16, 1998, pp. 1397–1399.

* cited by examiner

*Primary Examiner*—Mark Budd
(74) *Attorney, Agent, or Firm*—Dorsey & Whitney LLP

(57) ABSTRACT

A transducer suitable for ultrasonic applications, fluid drop ejection and scanning force microscopy. The transducer comprises a thin piezoelectric ring bonded to a thin fully supported clamped membrane. Voltages applied to said piezoelectric ring excite axisymmetric resonant modes in the clamped membrane.

8 Claims, 15 Drawing Sheets

MICROMACHINED TWO DIMENSIONAL ARRAY OF PIEZOELECTRICALLY ACTUATED FLEXTENSIONAL TRANSDUCERS

RELATED APPLICATION

This application is a continuation of co-pending application Ser. No. 09/098,011 filed Jun. 15, 1998, now U.S. Pat. No. 6,291,927, which is a continuation-in-part of application Ser. No. 08/530,919 filed Sep. 20, 1995, now U.S. Pat. No. 5,828,394 issued Oct. 27, 1998.

GOVERNMENT SUPPORT

The research leading to this invention was supported by the Defense Advanced Research Projects Agency of the Department of Defense, and was monitored by the Air Force Office of Scientific Research under Grant No. F49620-95-1-0525.

BRIEF SUMMARY OF THE INVENTION

This invention relates generally to piezoelectrically actuated flextensional transducer arrays and method of manufacture, and more particularly to such transducer arrays which can be used as ultrasonic transducers, fluid drop ejectors and in scanning force microscopes.

BACKGROUND OF THE INVENTION

Fluid drop ejectors have been developed for inkjet printing. Nozzles which allow the formation and control of small ink droplets permit high resolution, resulting in printing sharper characters and improved tonal resolution. Drop-on-demand inkjet printing heads are generally used for high-resolution printers. In general, drop-on-demand technology uses some type of pulse generator to form and eject drops. In one example, a chamber having a nozzle orifice is fitted with a piezoelectric wall which is deformed when a voltage is applied. As a result of the deformation, the fluid is forced out of the nozzle orifice and impinges directly on an associated printing surface. Another type of printer uses bubbles formed by heat pulses to force fluid out of the nozzle orifice.

There is a need for an improved fluid drop ejector for use not only in printing, but also, for photoresist deposition in the semiconductor and flat panel display industries, drug and biological sample delivery, delivery of multiple chemicals for chemical reactions, DNA sequences, and delivery of drugs and biological materials for interaction studies and assaying. There is also need for a fluid ejector that can cover large areas with little or no mechanical scanning.

Various types of ultrasonic transducers have been developed for transmitting and receiving ultrasound waves. These transducers are commonly used for biochemical imaging, non-destructive evaluation of materials, sonar, communication, proximity sensors and the like. Two-dimensional arrays of ultrasound transducers are desirable for imaging applications. Making arrays of transducers by dicing and connecting individual piezoelectric elements is fraught with difficulty and expense, not to mention the large input impedance mismatch problem that such elements present to transmit/receiving electronics.

Scanning force microscopes have been applied to many kinds of samples which cannot be imaged by the other scanning probe microscopes. Indeed, they have the advantage of being applicable to the biological science field where, in order to image living biological samples, the development of scanning force microscopes in liquid with minimum heat production specification is needed. In addition, non-contact scanning force microscopes operating in liquid would permit imaging soft and sensitive probe lithography and high density data storage. Two dimensional arrays of atomic force probes with self-exciting piezoelectric sensing would provide a scanning force microscope which would meet the identified needs.

OBJECTS AND SUMMARY OF THE INVENTION

It is an object of the present invention to provide a flextensional piezoelectric transducer array for use in ultrasonic transducers, droplet ejectors and scanning force microscopes.

It is another object of the invention to provide a fluid drop ejector having an array of piezoelectrically actuated flextensional transducers in which the drop size, drop velocity, ejection rate and number of drops can be easily controlled.

It is another object of the invention to provide a micromachined flextensional membrane array with each membrane having a piezoelectric transducer which is selectively addressed.

It is a further object of the invention to provide a fluid drop ejector in which a membrane including a nozzle is actuated to eject droplets of fluid, at or away from the mechanical resonance of the membrane.

It is another object of the present invention to provide an array of piezoelectric flextensional transducers which can be used for sending and receiving sound, and which can be selectively addressed for ultrasonic imaging.

It is a further object of the present invention to provide an array of flextensional piezoelectrically actuated membranes which are electrostatically positioned.

The foregoing and other objects are achieved by an array of flextensional membranes, each provided with a piezoelectric transducer which can activate the membrane and/or provide a signal representing membrane displacement.

BRIEF DESCRIPTION OF THE DRAWINGS

The foregoing and other objects of the invention will be more fully understood from the following description read in connection with the accompanying drawings, wherein.

DESCRIPTION OF THE PREFERRED EMBODIMENTS

Figure 1:
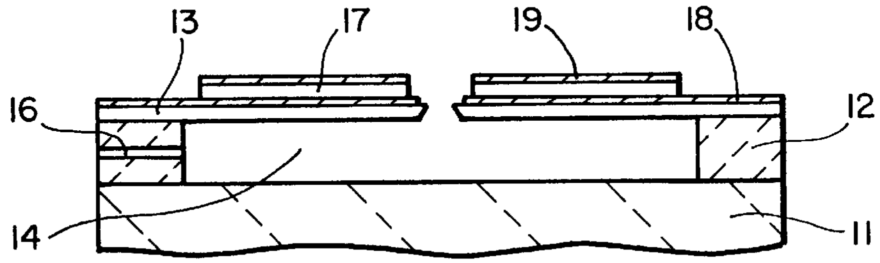
FIG. 1 is a sectional view of a piezoelectrically actuated transducer in accordance with the invention.
Figure 2:
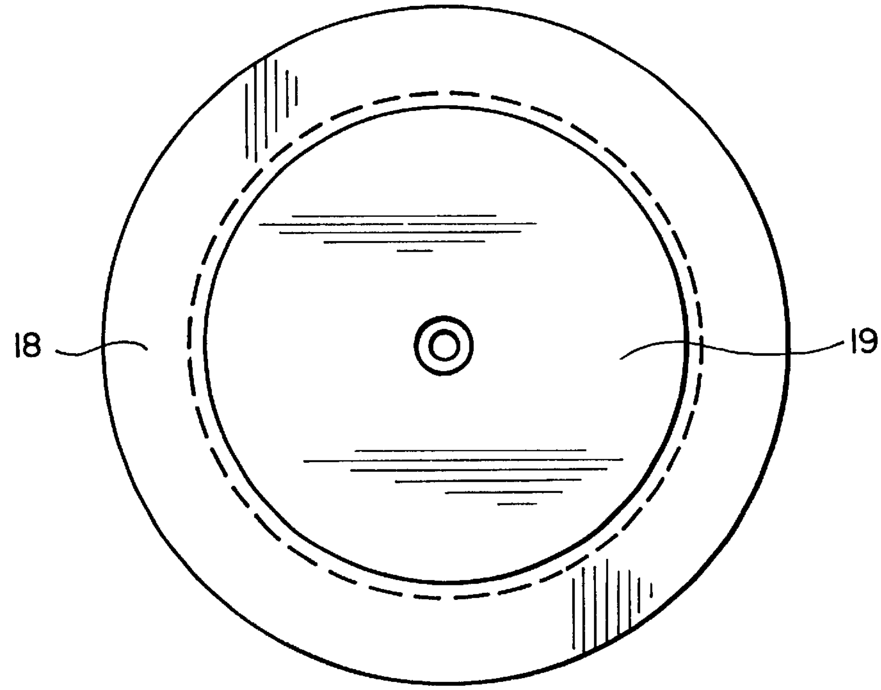
FIG. 2 is a top plan view of the ejector shown in FIG. 1.

A piezoelectrically actuated flextensional transducer according to one embodiment of this invention is shown in FIGS. 1 and 2. The transducer includes a support body or substrate 11 which can have apertures for the supply of fluid if it is used as a droplet ejector as will be presently described. A cylindrical wall 12 supports and clamps an elastic membrane 13. The support 11, wall 12 and membrane 13 define a reservoir 14. When the transducer is used as a droplet ejector, an aperture 16 may be formed in the wall 12 to permit continuous supply of fluid into the reservoir to replenish fluid which is ejected, as will be presently described. The fluid supply passage could be formed in the support body or substrate 11. A piezoelectric annular transducer 17 is attached to or formed on the upper surface of the membrane 13. The transducer 17 includes conductive contact films 18 and 19. The piezoelectric film can also be formed on the bottom surface of the membrane, or can itself be the membrane.

Figure 4A:
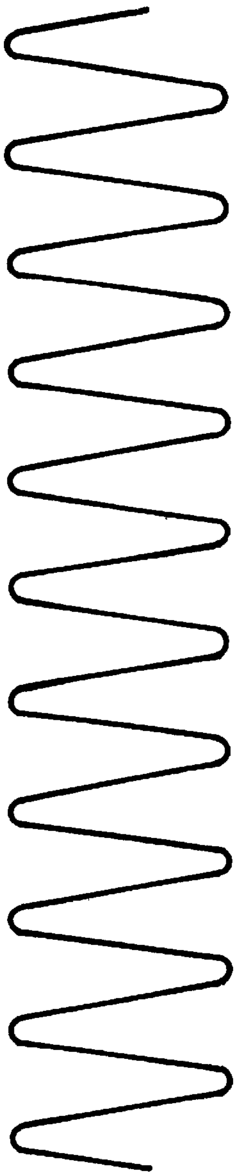
FIGS. 4A–4C show the ac voltage applied to the piezoelectric transducer of the piezoelectrically actuated transducers of FIGS. 1 and 2, the mechanical oscillation of the membrane, and continuous ejection of fluid drops.
Figure 4B:
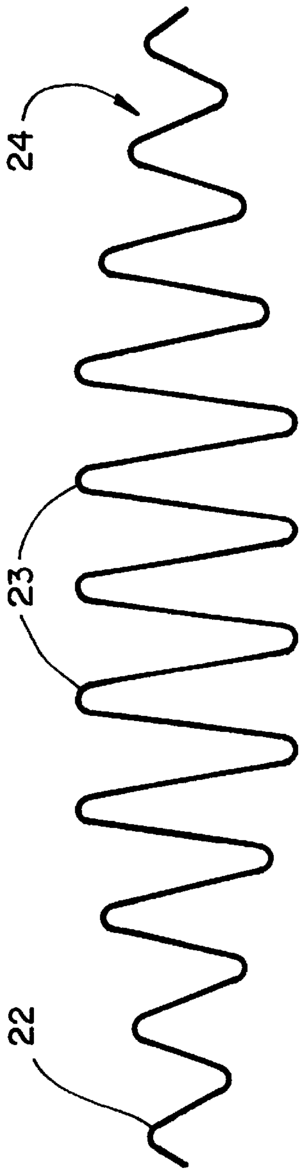
Figure 4C:
Figure 5A:
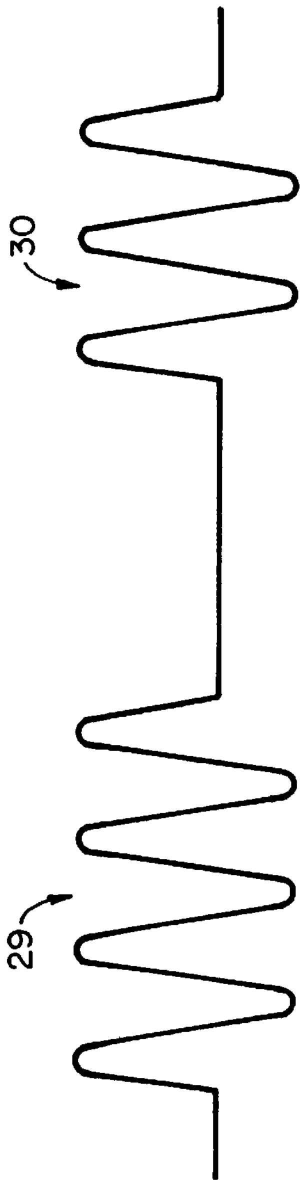
FIGS. 5A–5C show the application of ac voltage pulses to the piezoelectric transducer of the piezoelectrically actuated transducer of FIGS. 1 and 2, the mechanical oscillation of the membrane and the drop-on-demand ejection of drops.
Figure 5B:
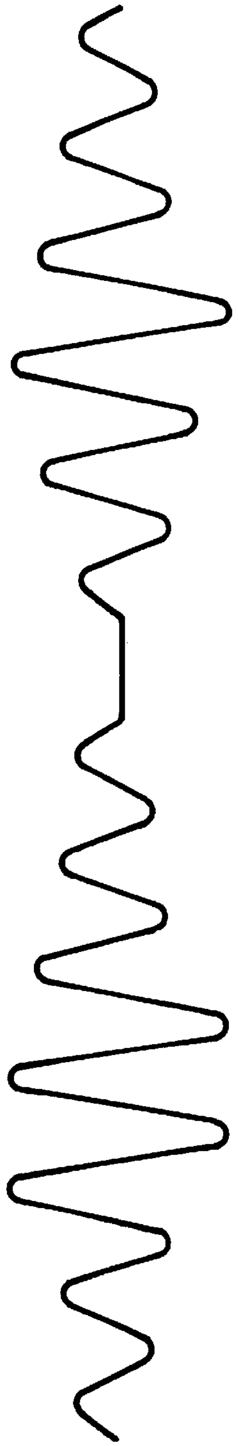
Figure 5C:
Figure 6A:
FIGS. 6A–6C show the first three mechanical resonant modes of a membrane as examples among all the modes of superior order in accordance with the invention.
Figure 6B:
Figure 6C:
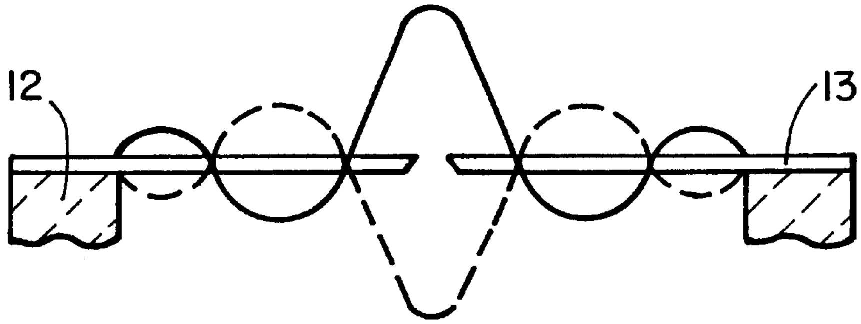

When the piezoelectrically actuated transducer is used as an ultrasound transmitter or receiver, or as a fluid droplet ejector, or in a scanning force microscope, the clamped membrane is driven by the piezoelectric transducer so that it mechanically oscillates preferably into resonance. This is illustrated in FIGS. 4 through 6. FIG. 4A shows a sine wave excitation voltage which is applied to the piezoelectric transducer. The transducer applies forces to the membrane responsive to the applied voltage. FIG. 4B shows the amplitude of deflection at the center of the membrane responsive to the applied forces. It is noted that when the power is first applied, the membrane is only slightly deflected by the first power cycle, as shown at 22, FIG. 4B. The deflection increases, whereby, in the present example, at the third cycle, the membrane is in maximum deflection, as shown at 23, FIG. 4B. At this point, its deflection cyclically continues at maximum deflection with the application of each cycle of the applied voltage. When the transducer is used as a droplet ejector, it permits the ejection of each corresponding drop, as shown in FIG. 4C. When the power is turned off, the membrane deflection decays as shown at 24, FIG. 4B. The frequency at which the membrane resonates is dependent on the membrane material, its elasticity, thickness, shape and size. The shape of the membrane is preferentially circular; however, the other shapes, such as square, rectangular, etc., can be made to resonate and eject fluid drops. In particular, an elliptic membrane can eject two drops from its focal points at resonance. The amount of deflection depends on the magnitude of the applied power. FIG. 6 shows, for a circular membrane, that the membrane may have different modes of resonant deflection. FIG. 6A shows deflection at its fundamental frequency; FIG. 6B at the first harmonic and FIG. 6C at the second harmonic.

Figure 7A:
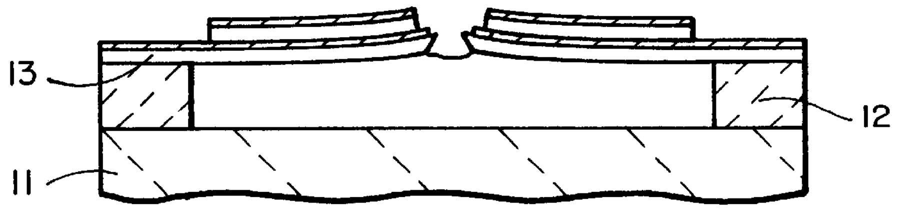
FIGS. 7A–7D show the deflection of the membrane responsive to the application of an excitation ac voltage to the piezoelectric transducer and the ejection of droplets in response thereto.
Figure 7B:
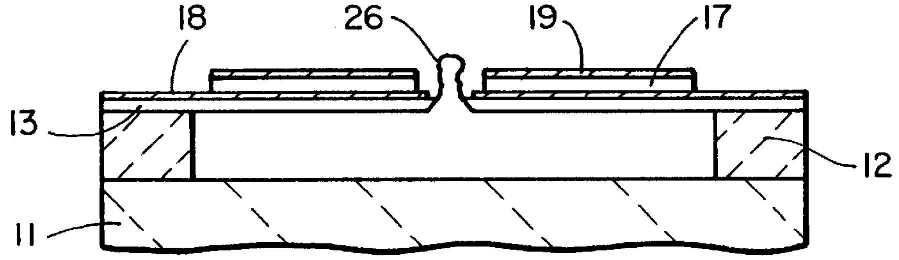
Figure 7C:
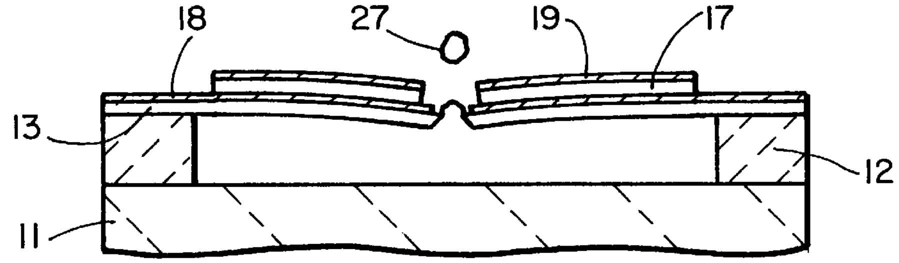
Figure 7D:
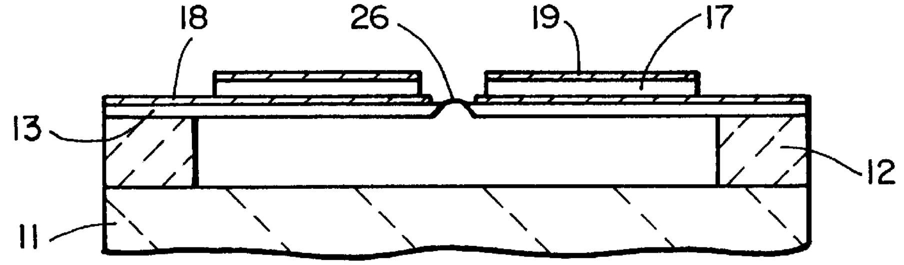

The action of the membrane to eject drops of fluid is illustrated in FIGS. 7A–7D. These figures represent the deflection at the fundamental resonance frequency. FIG. 7A shows the membrane deflected out of the reservoir, with the liquid in contact with the membrane. FIG. 7B shows the membrane returning to its undeflected position, and forming an elongated bulb of fluid 26 at the orifice nozzle. FIG. 7C shows the membrane extending into the reservoir and achieving sufficient velocity for the bulb 26 to cause it to break away from the body of fluid and form a droplet 27 which travels in a straight line away from the membrane and nozzle toward an associated surface such as a printing surface. FIG. 7D represents the end of the cycle and the shape of the fluid bulb 26 at that point.

Referring to FIG. 4C, it is seen that the membrane reaches maximum deflection upon application of the third cycle of the applied voltage. It then ejects drops with each cycle of the applied voltage as long as the applied voltage continues. FIGS. 5A–5C show the application of excitation pulses. At 29, FIG. 5A, a four-cycle pulse is shown applied, causing maximum deflection and ejection of two single drops, FIG. 5C. The oscillation then decays and no additional drops are ejected. At 30, three cycles of power are applied, ejecting one drop, FIG. 5C. It is apparent that drops can be produced on demand. The drop rate is equal to the frequency of the applied excitation voltage. The drop size is dependent on the size of the orifice and the magnitude of the applied voltage. The fluid is preferably fed into the reservoir at constant pressure to maintain the meniscus of the fluid at the orifice in a constant concave, flat, or convex shape, as desired. The fluid must not contain any air bubbles, since it would interfere with operation of the ejector.

Figure 3:
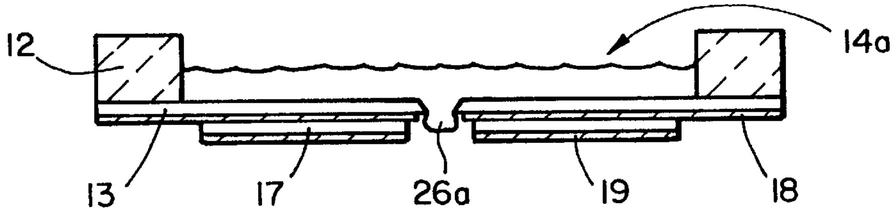
FIG. 3 is a sectional view of a drop-on-demand fluid drop ejector using a piezoelectrically actuated transducer in accordance with the invention.

FIG. 3 shows a fluid drop ejector which has an open reservoir 14*a*. The weight of the fluid keeps the fluid in contact with the membrane. The bulb 26*a* is ejected by deflection of the membrane 13 as described above.

A fluid drop ejector of the type shown in FIG. 3 was constructed and tested. More particularly, the resonant membrane comprised a circular membrane of steel (0.05 mm in thickness; 25 mm in diameter, having a central hole of 150 $\mu$m in diameter). This membrane was supported by a housing composed of a brass cylinder with an outside diameter of 25 mm and an inside diameter of 22.5 mm. The membrane was actuated by an annular piezoelectric plate bonded on its bottom and on axis to the circular membrane. The annular piezoelectric plate had an outside diameter of 23.5 mm and an inside diameter of 18.8 mm. Its thickness was 0.5 mm. The reservoir was formed by the walls of the housing and the top was left open to permit refilling with fluid. The device so constructed ejected drops of approximately 150 $\mu$m in diameter. The ejection occurred when applying an alternative voltage of 15 V peak to the piezoelectric plate at a frequency of 15.5 KHz (with 0.3 KHz tolerance of bandwidth), which corresponded to the resonant frequency of the liquid loaded membrane. This provided a bending motion of the membrane with large displacements at the center. Thousands of identical drops were ejected in one second with the same direction and velocity. The level of liquid varied from 1–5 mm with continuous ejection while applying a slight change in frequency to adapt to the change in the resonant frequency of the composite membrane due to different liquid loading. When the level of liquid remained constant, the frequency of drop formation remained relatively constant. The excitation was sinusoidal, although square waves and triangular waveforms were used as harmonic signals and also gave continuous drop ejection as the piezoelectric material was excited to cause flextensional vibration of the membrane.

As will be presently described, the fluid drop ejector can be implemented using micro-machining semiconductive materials employing semiconductor processing technologies. The housing could be silicon and silicon oxide, the membrane could be silicon nitride, and the piezoelectric transducer could be a deposited thin film such as zinc oxide. In this manner, the dimensions of an ejector could be no more than 100 microns and the orifice could be anywhere from a few to tens of microns in diameter. Two-dimensional matrices can be easily implemented for printing at high speed with little or no relative motion between the fluid drop ejector and object upon which the fluid is to be deposited.

It is apparent that the piezoelectrically actuated flextensional membranes can be vibrated to generate sound in air or water by driving the piezoelectric transducer at the proper frequency. The individual piezoelectrically actuated transducers forming the array are designed to have a maximum displacement at the center of the membrane at the resonant frequency. The complexity of the structure and the fact that the piezoelectric transducer is a ring rather than a full disk, necessitates the use of finite element analysis to determine the resonant frequencies of the composite structure, the input impedance of the piezoelectric transducer, and the normal displacement of the surface.

It is well know that the transverse displacement ξ of a simple membrane of uniform thickness, in vacuum, obeys the following differential equation:

$$\nabla^4 \xi + \frac{\rho}{D}\frac{\partial^2 \xi}{\partial t^2} = 0 \quad (1)$$

The axisymmetric free vibration frequencies for an edge-clamped circular membrane are given by $$\omega = \frac{\lambda^2}{a^2\sqrt{\rho/D}} \quad (2)$$

where λ represents the eigenvalues of Eq. (1), α is the radius of the membrane, ρ is the mass per unit area of the membrane, and $$D = \frac{Eh^3}{12(1-v^2)} \quad (3)$$

where E is Young's modulus, h is the membrane thickness, and v is Poisson's ratio. The above equations suggest that the resonant frequency is directly proportional to the thickness of the membrane and inversely proportional to the square of the radius. However, it is also known that the resonant frequency will be decreased by fluid loading on one or both sides of the membrane. The shift in the fluid loaded resonant frequency of a simple membrane is $$f_w = \frac{f_a}{\sqrt{1+\beta\Gamma}} \quad (4)$$

where $\beta=\rho_w a/\rho_m h$ is a thickness correction factor, $\rho_w$ is the density of the liquid, $\rho_m$ is the mass density of the circular membrane, and Γ is the non-dimensional added virtual mass incremental (NAVMI) factor, which is determined by boundary conditions and mode shape. For the first order axisymmetric mode and for water loading on one side of the membrane, Γ is 0.75. The resonant frequency can be expected to shift down by about 63%.

The foregoing membrane analysis is also applicable to the droplet ejector application of the piezoelectrically actuated flextensional transducer and the resonant frequency of the membrane will be shifted down as discussed above.

Figure 8A:
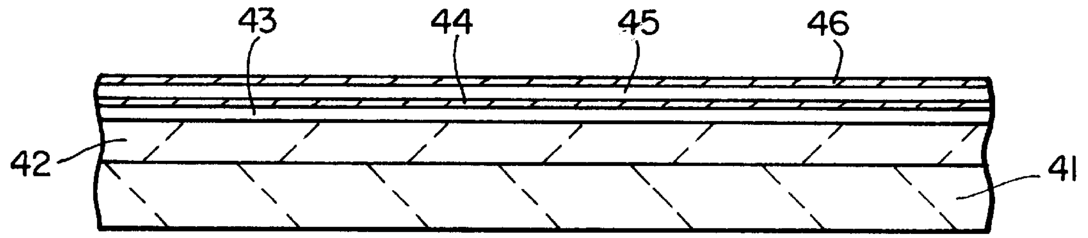
FIGS. 8A–8D show the steps in the fabrication of a matrix of piezoelectrically actuated flextensional transducers of the type shown in FIGS. 1 and 2.
Figure 8B:
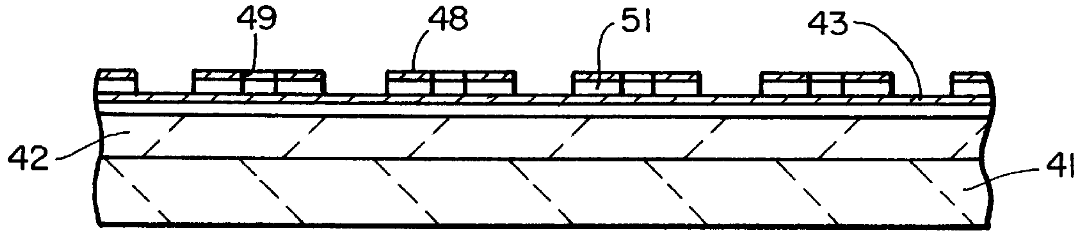
Figure 8C:
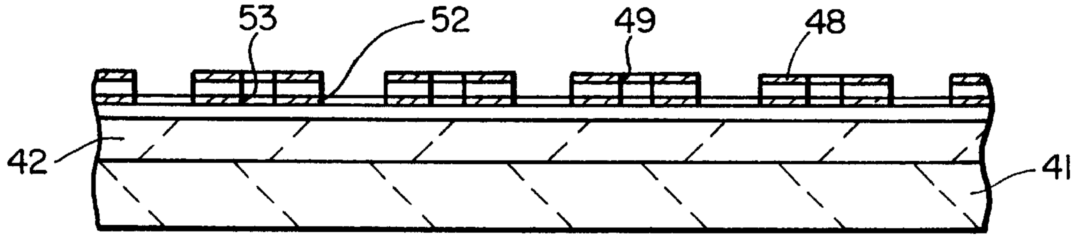
Figure 8D:
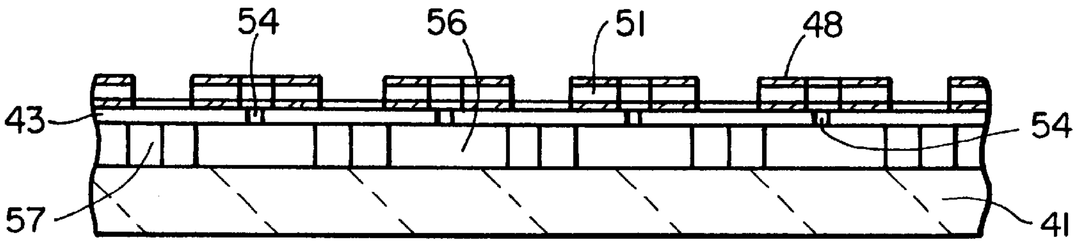

Referring to FIGS. 8A–8D, the steps of fabricating a matrix of piezoelectrically actuated transducers of the type shown in FIGS. 1 and 2 from semiconductor material are shown for a typical process. By well-known semiconductor film or layer-growing techniques, a silicon substrate 41 is provided with successive layers of silicon oxide 42, silicon nitride 43, metal 44, piezoelectric material 45 and metal 46. The next steps, shown in FIG. 8B, are to mask and etch the metal film 46 to form disk-shaped contacts 48 having a central aperture 49 and interconnected along a line 50, FIG. 9. The next step is to etch the piezoelectric layer in the same pattern to form transducers 51. The next step, FIG. 8C, is to mask and etch the metal film 44 to form disk-shaped contacts 52 having central apertures 53 and interconnected along columns 55, FIG. 9. The next steps, FIG. 8D, are to mask and etch orifices 54 in the silicon nitride layer 43. This is followed by selectively etching the silicon oxide layer 42 through the orifices 54 to form a fluid reservoir 56. The silicon nitride membrane 43 is supported by silicon oxide posts 57.

Figure 9:
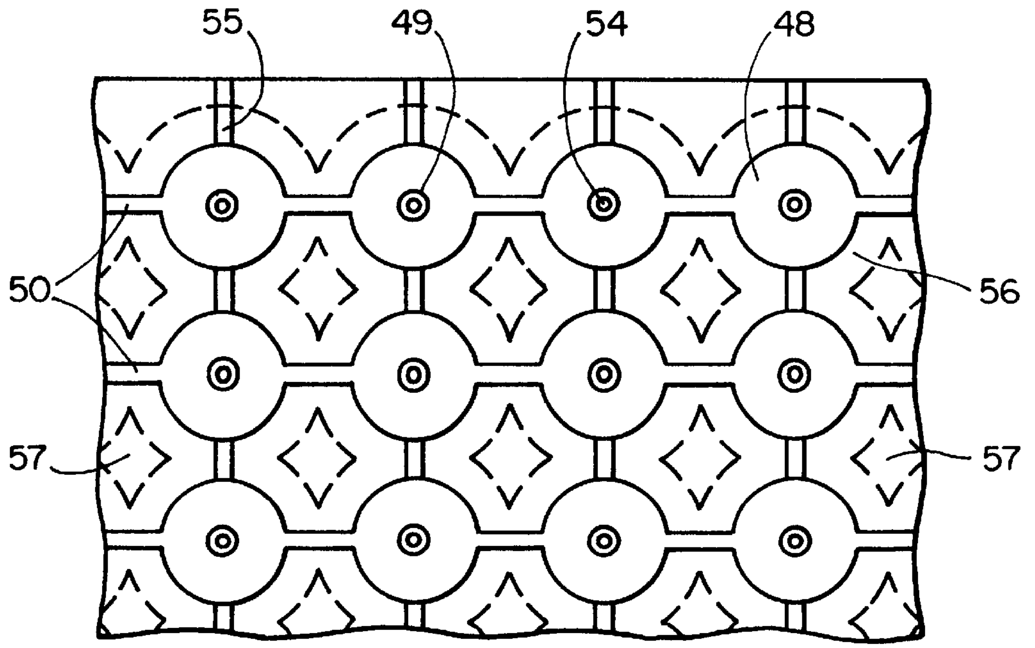
FIG. 9 is a top plan view of a matrix fluid drop ejector formed in accordance with the process of FIGS. 8A–8D.

FIG. 9 is a top plan view of the matrix shown in FIGS. 8A–8D. The dotted outline shows the extent of the fluid reservoir. It is seen that the membrane is supported by the spaced posts 57. The upper contacts of the piezoelectric members in the horizontal rows are interconnected along the lines 50 as shown and the lower contacts of the piezoelectric members in the columns are interconnected along lines 55 as shown, thereby giving a matrix in which the individual membranes can be excited, thereby ejecting selected patterns of drops or to direct ultrasound.

By micro-machining, closely spaced patterns of orifices or nozzles can be achieved. If the spacing between orifices is 100 μm, the matrix will be capable of simultaneously depositing a resolution of 254 dots per inch. If the spacing between orifices is 50 μm, the matrix will be capable of simultaneously depositing a resolution of 508 dots per inch. Such resolution would be sufficient to permit the printing of lines or pages of text without the necessity of relative movement between the print head and the printing surface.

Figure 10:
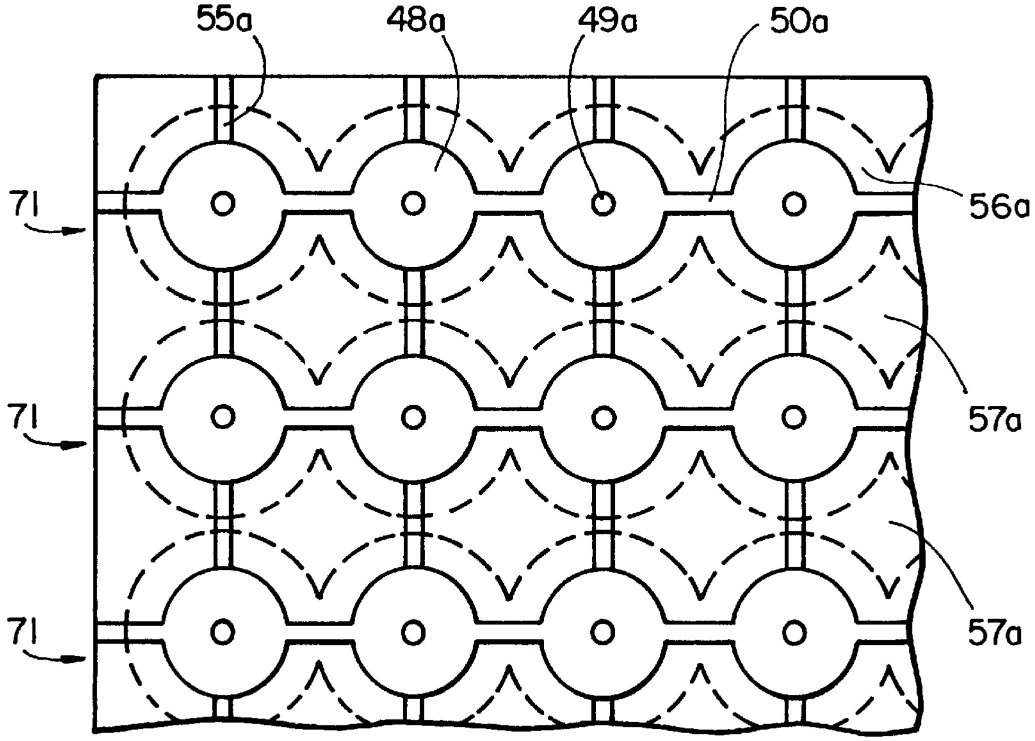
FIG. 10 shows another embodiment of a matrix fluid drop ejector.
Figure 11A:
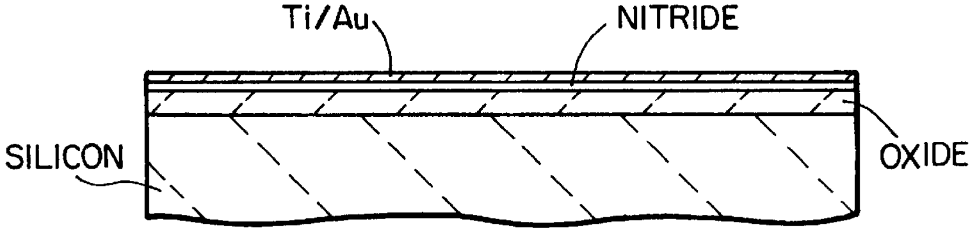
FIGS. 11A–11E show the steps for the fabrication of a matrix of piezoelectrically actuated flextensional transducer in accordance with another procedure.
Figure 11B:
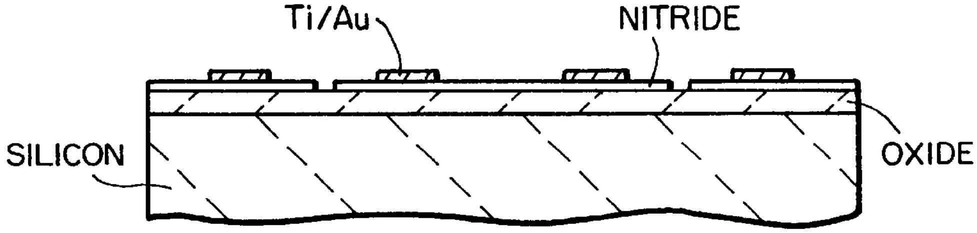
Figure 11C:
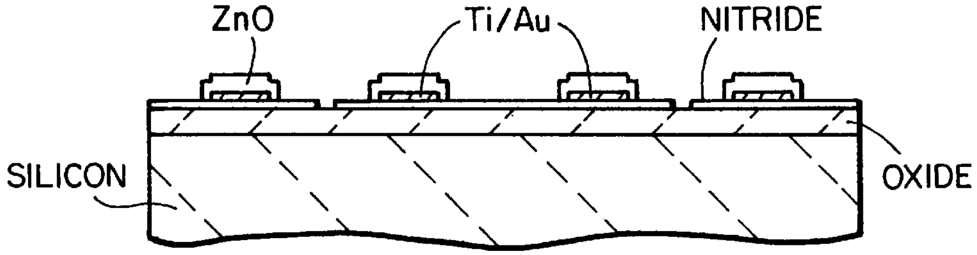
Figure 11D:
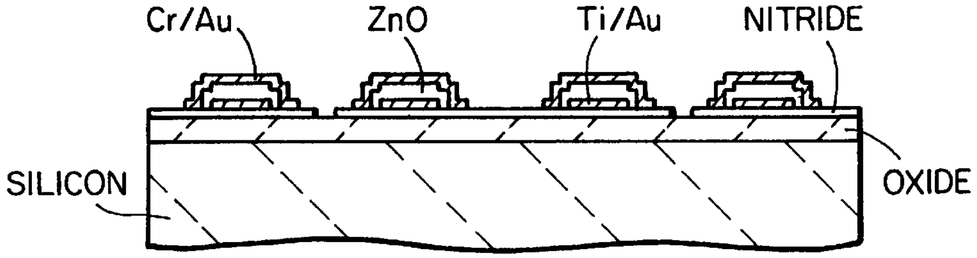
Figure 11E:
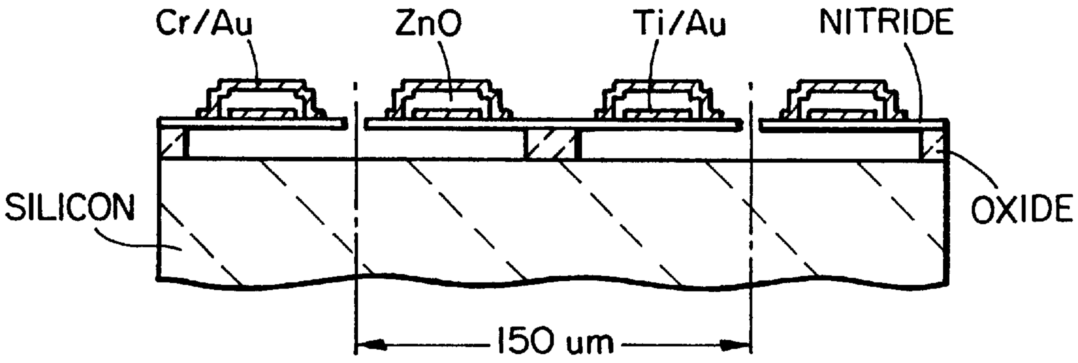

The invention has been described in connection with the ejection of a single fluid as, for example, for printing a single color or delivering a single biological material or chemical. It is apparent that ejectors can be formed for ejecting two or more fluids for color printing and chemical or biological reactions. The spacing of the apertures and the size and location of the associated membranes can be selected to provide isolated reservoirs or isolated columns or rows of interconnected reservoirs. Adjacent rows or columns or reservoirs can be provided with different fluids. An example of matrix of fluid ejectors having isolated rows of fluid reservoirs is shown in FIG. 10. The fluid reservoirs **56*a* are interconnected along rows 71. The rows are isolated from one another by the walls 57***a*. Thus, each of the rows of reservoirs can be supplied with a different fluid. Individual ejectors are energized by applying voltages to the interconnections 50*a* and 55*a*. The illustrated embodiment is formed in the same manner as the embodiment of FIG. 9 by controlling the spacing of the apertures and/or the length of sacrificial etching. The processing of the fluid drop ejector assembly can be controlled so that there are individual fluid reservoirs with individual isolated membranes. The spacing and location of apertures and etching can be controlled to provide ultrasonic transducers having individual or combined transmitting membranes.

The preferred fabrication process for micromachined two dimensional array flextensional transducers is given in FIGS. 11A–G. The process starts with growing a sacrificial layer, chosen to be silicon oxide. A membrane layer of low-pressure chemical vapor deposition silicon nitride is grown on top of the sacrificial layer. The bottom Ti/Au electrode layer for the piezoelectric transducers is deposited on the membrane by e-beam evaporation. The bottom metal layer is patterned by wet etch, and access holes for sacrificial layer etching are drilled in the membrane layer by plasma etch, FIG. 11B. A piezoelectric ZnO layer is deposited on top of the bottom electrode by dc planar magnetron reactive sputtering. The ZnO layer is patterned by masking and wet etching, FIG. 11C. The top Cr/Au electrode layer is then formed by e-beam evaporation at room temperature and patterned by liftoff, FIG. 11D. The last step is etching the sacrificial layer by wet etch, FIG. 11E, and this concludes the front surface micromachining of the piezoelectrically actuated flextensional array of transducers.

Figure 12:
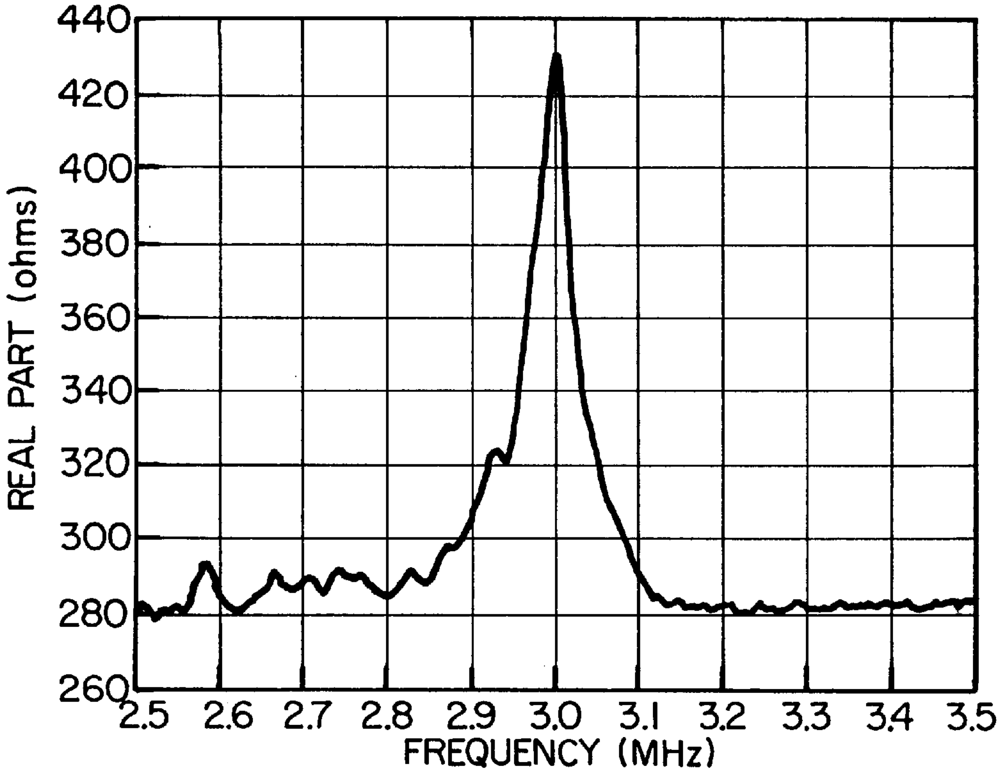
FIG. 12 shows the real part of the input impedance of the transducer matrix of FIG. 11 as a function of frequency.
Figure 13:
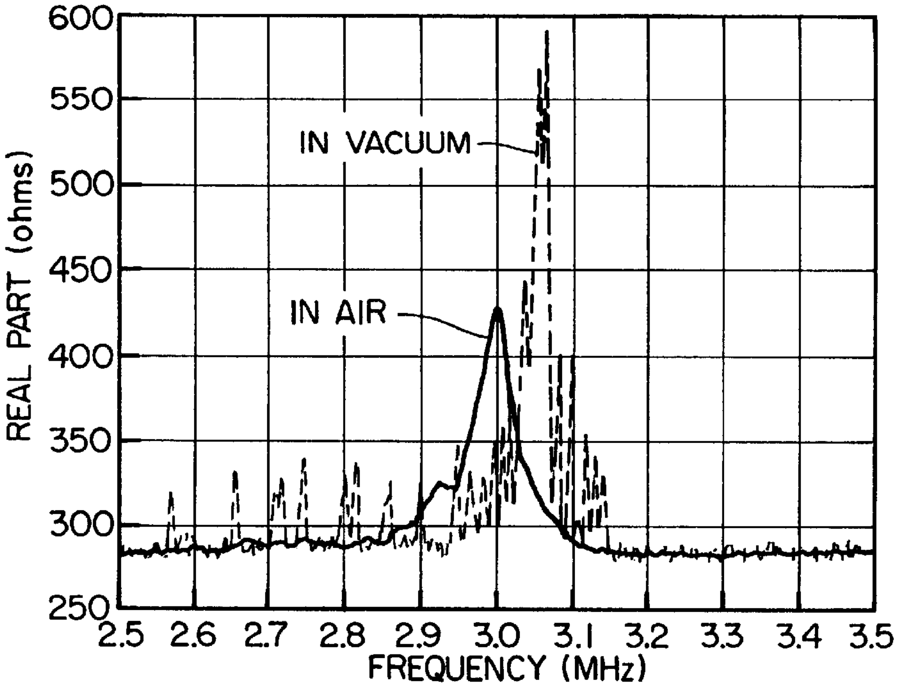
FIG. 13 shows the change in the real part of the input impedance of the transducer matrix of FIG. 11 in air and vacuum as a function of frequency.
Figure 14:
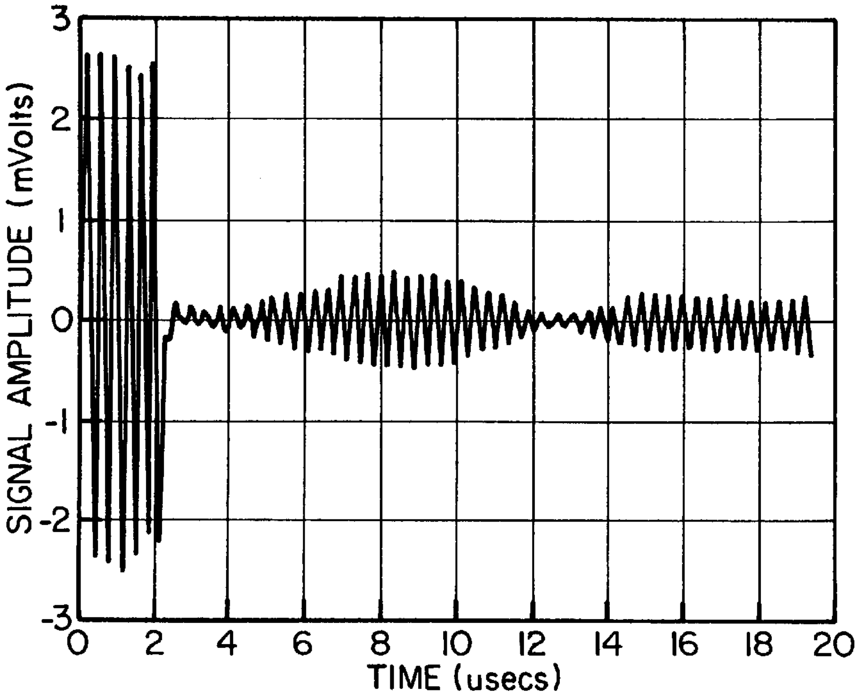
FIG. 14 shows the transmission of ultrasound in air in the transducer matrix of FIG. 11.
Figure 15A:
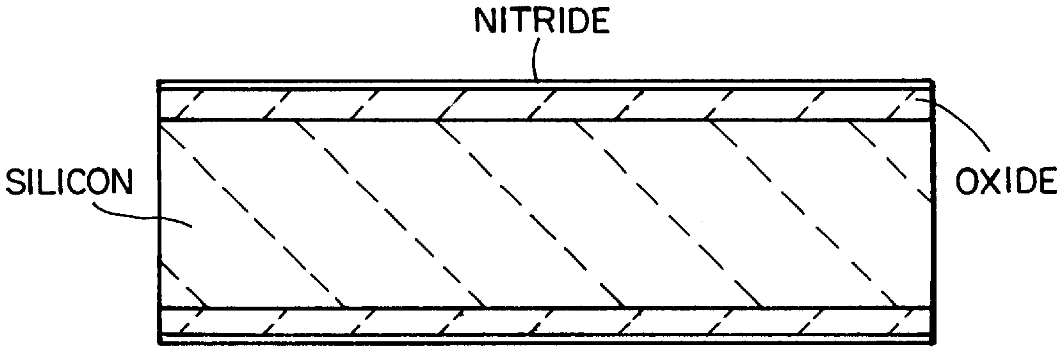
FIGS. 15A–15H show the steps in fabricating a piezoelectrically actuated flextensional transducer matrix in accordance with a back process.
Figure 15B:
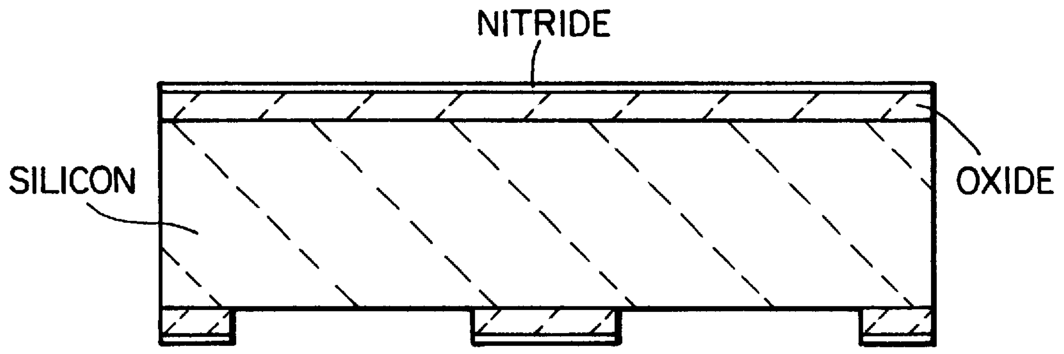
Figure 15C:
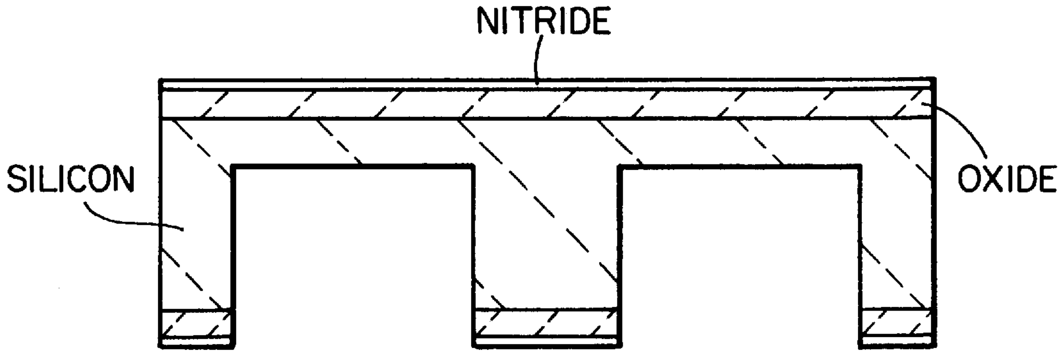
Figure 15D:
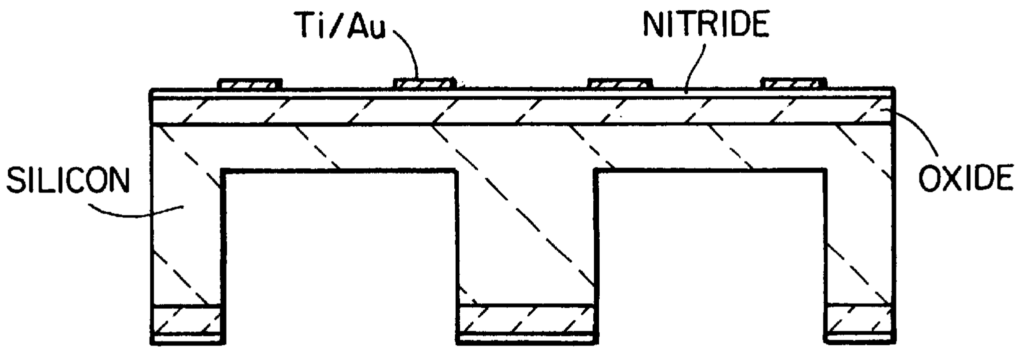
Figure 15E:
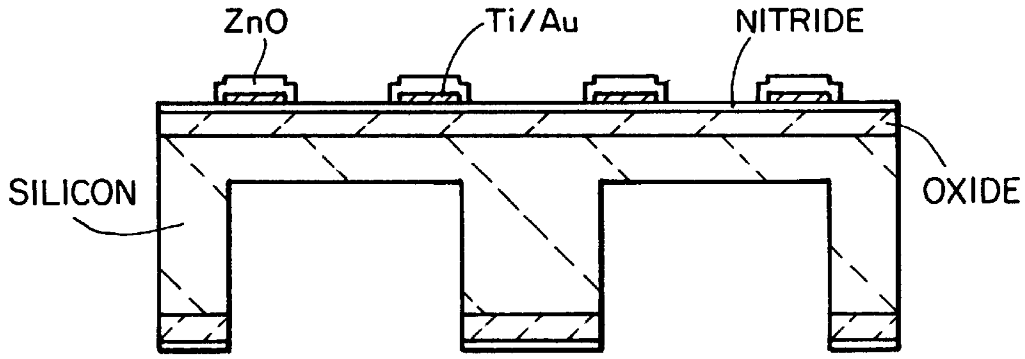
Figure 15F:
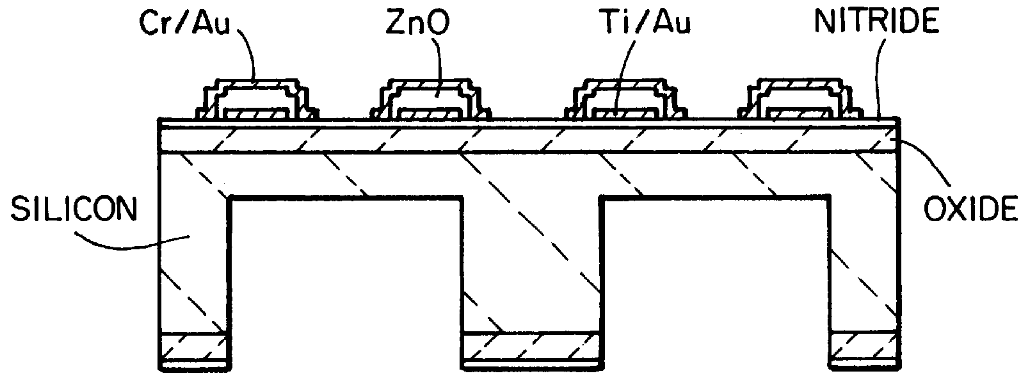
Figure 15G:
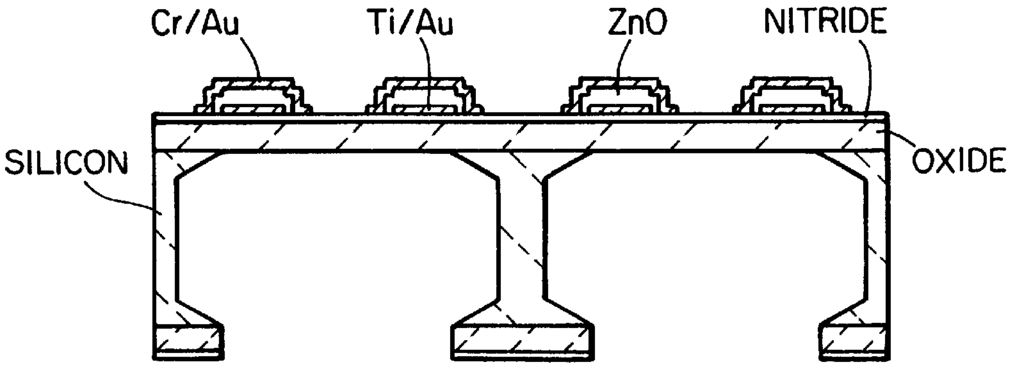
Figure 15H:
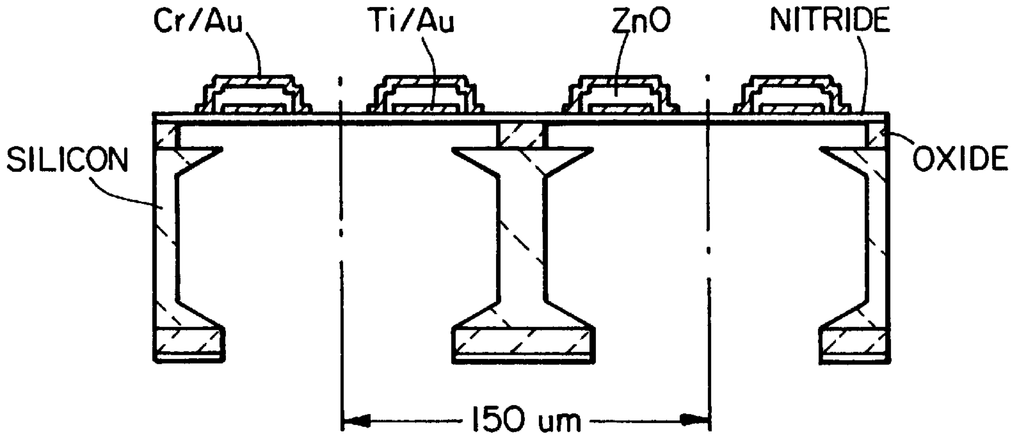

FIG. 12 shows the real part of the electrical input impedance of only one row of 60 elements of devices formed in accordance with the above which on center are spaced 150 $\mu$m apart. The silicon nitride membrane was 0.3 $\mu$m thick and had a diameter of 90 $\mu$m. Operating in air, the transducers had a resonant frequency of 3.0 MHz and a fractional bandwidth of about 1.5%. The real part of the electrical input impedance was a 280 Ω base value. It was determined by SPICE simulation that this base value is caused by the bias lines connecting the individual array elements. This can be avoided by using electroplating to increase the thickness of the bias lines. FIG. 12 also shows the existence of acoustical activity in the device, and an acoustic radiation resistance $R_a$ of 150 Ω. FIG. 13 presents the change of the electrical input impedance in vacuum of a device consisting of one row of 60 3.07 MHz in vacuum (at 50 mTorr). This result is in accordance with expectations, since the resonant frequency and the real part of electrical input impedance at resonance should increase in vacuum. FIG. 14 shows the result of an air transmission experiment where an acoustic signal is received following the electromagnetic feedthrough. The insertion loss is 112 dBs. In the transmit/receive experiment, the receiver had one row of 60 elements, and the transmitter had two rows of 120 elements. Loss due to electrical mismatches was 34.6 dBs. Other important loss sources are alignment of receiver and transmitter, and structural losses.

An alternative micromachining fabrication process can be employed to manufacture micromachined two dimensional array flextensional ultrasonic transducers and droplet ejectors by using a back process concept. FIGS. 15A–15J illustrate the process flow for this embodiment of the invention. A sacrificial layer and membrane are grown on a relatively thin, i.e. 200 $\mu$m double side polished silicon wafer. The silicon oxide and silicon nitride on the back surface are patterned to have access openings from the back side to the silicon by dry plasma etch, FIG. 15B. The silicon is etched until enough silicon is left to support subsequent process steps, FIG. 15C. Bottom metal electrode layer is deposited on the upper surface and patterned, FIG. 15D. A Piezoelectric layer is deposited and patterned, FIG. 15E. And top metal electrode layer is formed by the liftoff method, FIG. 15F. At this step, lithography can be used to form orifices for droplet ejectors; however, this is not shown. Later, isotropic or anisotropic silicon wet etchant is used to remove the remaining supporting silicon, FIG. 15G. At this step, the front surface of the wafer is protected by a mechanical fixture or protective polymer film. After removing the remaining silicon, the sacrificial layer is etched by wet etch, FIG. 15H. Note that, depending on the size of holes etched from the back, sacrificial layer may not be needed at all.

Orifices for droplet ejectors may be drilled by dry plasma etching. The structure can be bounded to glass or other kind of support. This will provide access for liquid in case of droplet ejectors, and an ability of changing back pressure and boundary conditions, i.e., different back load impedance by filling different liquids in the back of the membrane, in ultrasonic transducers.

Figure 16:
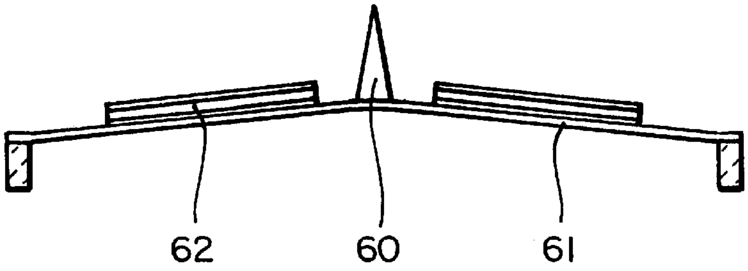
FIG. 16 shows an atomic force microscope probe mounted on the membrane of a piezoelectrically actuated flextensional transducer.

The flextensional piezoelectric transducer array can be used in a two dimensional scanning force microscope both for force sensing and nanometer scale lithography applications. Referring to FIG. 16, an individual probe 60 is shown on a deflected membrane 61 of a flextensional piezoelectric transducer having piezoelectric transducer 62. An array of individual probes mounted on individual membranes can be fabricated by micromachining in the vacuum previously described. An ac voltage is applied across the piezoelectric material to set the compound membrane into vibration. At the resonant frequencies of the compound membrane, the displacement of the probe tip is large. The tip sample spacing is controlled for each array element as by electrostatically deflecting the membrane applying a dc voltage to the piezoelectric transducer. A transducer array with electrostatic deflection of the membrane will be presently described.

In dynamic scanning force microscopy applications, the spring in the probe support is a critical component, the maximum deflection for a given force is needed. This requires a spring that is as soft as possible. At the same time, a stiff spring with high resonant frequency is necessary in order to minimize response time. On the other hand, we need the minimum number of passes of the probe tip and the maximum force that could be applied by a probe on a photoresist to achieve the desired patterning of the photoresist by the tip. This case requires a bigger spring constant and higher resonant frequency. Polysilicon membrane can be used to obtain higher spring constant values, whereas silicon nitride membrane can be used to obtain smaller spring constant values.

In scanning force microscopy, the probe dynamically scans across the sample surface. The dynamic mode is commonly divided into two modes, the non-contact mode and the cyclic-contact (tapping) mode. In the cyclic-contact mode, a raster probe vibrates at its resonant frequency and gradually approaches the sample until the probe tip taps the surface at the bottom of each vibration cycle. The cyclic-contact becomes the prevailing operation mode in air, because an SFM operated in this mode offers as high a resolution as an SFM operated in a contact mode. A cyclic-contact SFM does not damage the surface of soft samples as much as the contact SFM.

In the contact mode a feedback loop maintains the atomic force between the tip and the sample constant by adjusting the tip-sample spacing by electrostatic actuation or by piezoelectric actuation in case of individual addressing for each array element. On the other hand, pneumatic actuation can be used for tip-sample spacing without individual addressing. In case of tapping mode, the piezoelectric layer is utilized for exciting the membrane and detecting the membrane displacement, whereas electrostatic actuation is utilized to control the tip-sample spacing. By utilizing the admittance spectrum of the piezoelectric layer, the dynamic SFM can be easily constructed. In tapping mode, the peak height of the piezoelectric resonance spectrum (admittance) decreases by the tip-sample spacing. In addition, when the composite membrane operates in the tapping mode of the piezoelectric SFM, piezoelectric charge output detection may be used for the force sensing method.

Figure 17A:
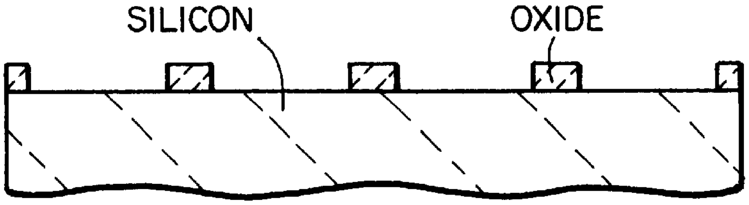
FIGS. 17A–17H show the steps in forming a matrix of transducers of the type shown in FIG. 16.
Figure 17B:
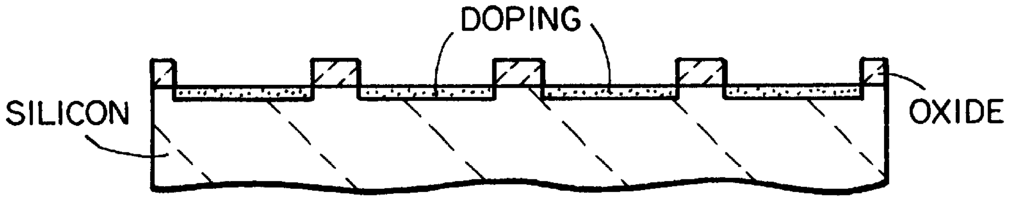
Figure 17C:
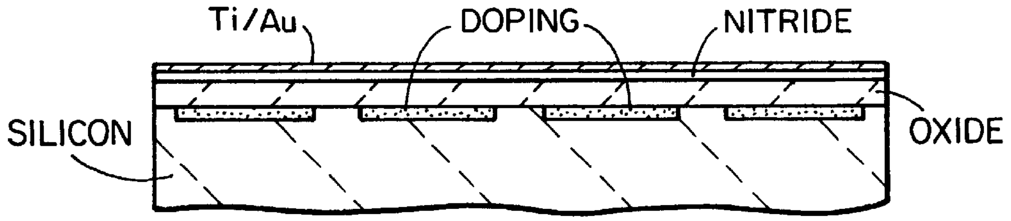
Figure 17D:
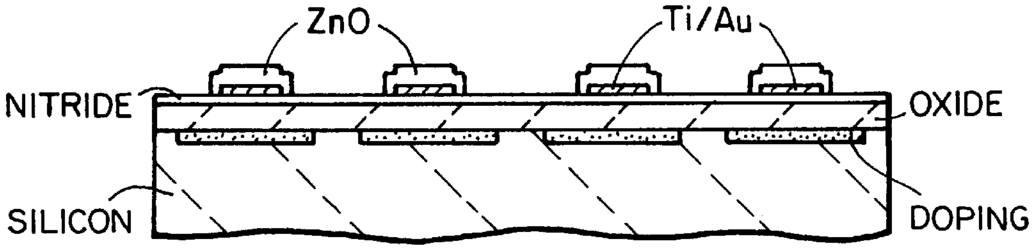
Figure 17E:
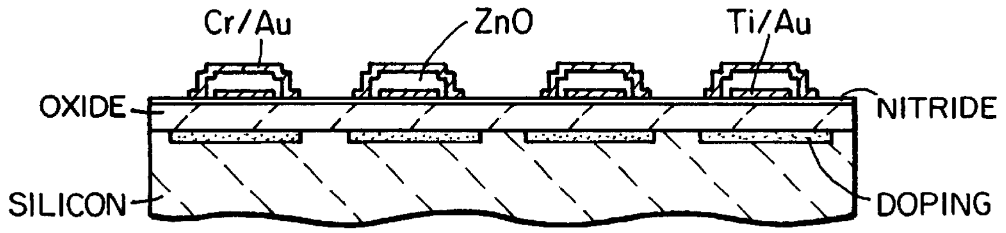
Figure 17F:
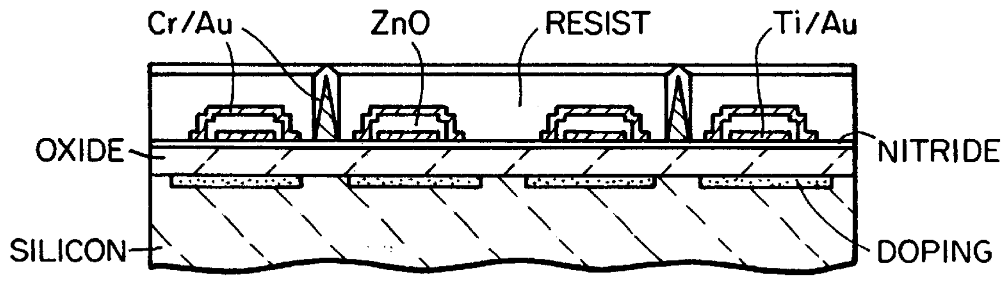
Figure 17G:
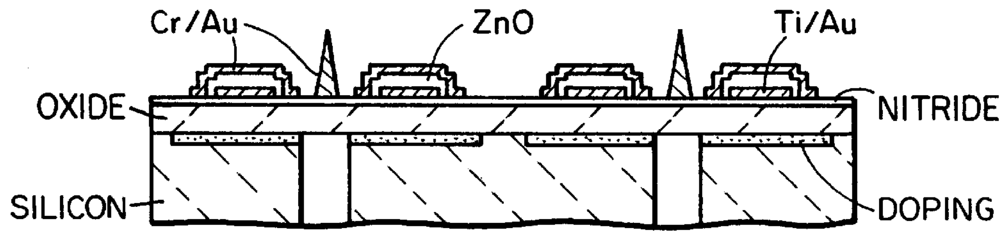
Figure 17H:
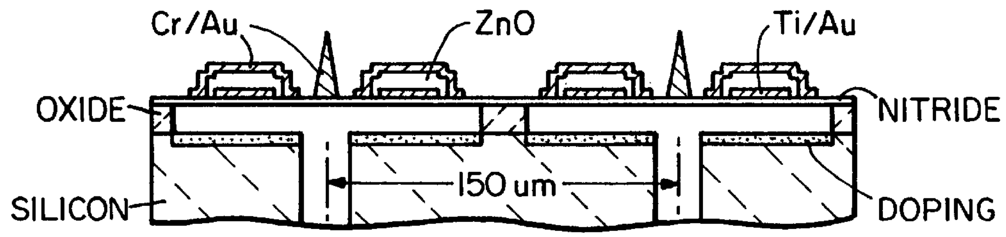

The fabrication process for micromachined two dimensional array of electrostatically deflected flextensional piezoelectrically actuated SFM probes is shown in FIG. 17A. The process starts with high resistivity silicon substrate. A thermal oxide layer used for masking in ion implantation is grown on the substrate, and patterned by wet etch in order to define the bottom electrode for electrostatic actuation, FIG. 17A. Dopant atoms are then implanted to form a conductive region which serves as the bottom electrode for electrostatic actuation of the flextensional membrane, FIG. 17B. After stripping of the masking oxide, a silicon oxide sacrificial layer is grown. The sacrificial layer can be patterned by lithography to define the lateral dimension of the individual array element. A membrane layer of LPCVD silicon nitride is grown on top of the sacrificial layer. Polysilicon can be used as membrane to obtain higher spring constant. The bottom Ti/Au electrode layer for a piezoelectric transducer is deposited on the membrane by e-beam evaporation, FIG. 17C. The bottom electrode layer is patterned by wet etch, and a piezoelectric ZnO layer is deposited on top of the bottom electrode, FIG. 17D. After patterning the ZnO layer by wet etch, the top Cr/Au electrode layer is formed by e-beam evaporation and patterned by liftoff, FIG. 17E. A Spindt tip or probe is formed at the center of the membrane by allowing holes defined in a sacrificial photoresist template layer to be self-occluded by evaporated Cr/Au layer, forming very sharp tips. Holes are etched in the back side by deep reactive ion etching thru the silicon substrate. These thru holes are not only used to remove the sacrificial layer, but also can be used for pneumatic actuation of the membrane to control the tip-sample spacing. The last step is etching the sacrificial layer by wet etch or by HF vapor plasmaless-gas-phase etch, FIG. 17H.

Micromachined two dimensional array flextensional transducers and droplet ejectors have common advantages over existing designs. First of all, they are micromachined in two dimensional arrays by using conventional integrated circuit manufacturing processes. They have piezoelectric actuation, that means AC signals drive the devices. The devices have optimized dimensions for specific materials.

For ultrasonic applications, devices can be broadband by utilizing different diameter of devices on the same die. Two dimensional array can be focused by appropriate addressing. Also, if the back process is used, the devices will have already sealed membranes, thus, they can be used as immersion transducers.

Micromachined two dimensional array flextensional piezoelectrically actuated droplet ejectors can eject any liquid as long as compatible membrane material is chosen. The device eject without any waste. They can be operated both in the drop-on-demand and the continuous mode. They may also eject small solid particles such as talc or photoresist. They can be used for ejecting expensive biological, chemical materials in small amounts.

The micromachined two dimensional array of flextensional transducers can be used in scanning atomic force microscopy. The array elements can be individually addressed for scanning. The array elements use self-excited piezoelectric sensing and electrostatic actuation. The device is capable of operating in high-vacuum, air, or liquid. Moreover, on-board driving, sensing, and addressing circuitries can be combined with the array.

Different materials can be used as sacrificial layer. Various materials can be used as membrane as long as they are compatible with sacrificial layer etch. In the back process, depending on the size of holes etched from back, sacrificial layer may not be needed at all. Other kinds of piezoelectric thin films, such as sputtered PZT and PVDF can be used instead of zinc oxide. Other metal thin films can be used instead of gold, since they are not exposed to any subsequent wet etch of other materials. Dimensions of devices can be optimized depending on where they will be used and what kinds of materials will be used in their fabrication.

What is claimed is:

1. A two-dimensional array of piezoelectrically actuated flextensional fluid drop ejectors comprising:

a plurality of membranes of semiconductor material having a selected area, said membranes each including one or more apertures, a support structure engaging the outer edges of each of said membranes to flexibly support the membranes, said support structure and said membranes configured to form fluid reservoirs so that fluid to be ejected is in contact with said membranes, a piezoelectric transducer carried on one surface of each of said membranes surrounding said aperture, said transducer including a body of piezoelectric material having first and second spaced opposite surfaces, conductive contacts on the opposite surfaces of said body of piezoelectric material for each of said transducers for applying a voltage across said piezoelectric material to cause flextensional movement of said body of piezoelectric material whereby the associated membrane flexes responsive to applied voltage whereby the application of an ac voltage of predetermined frequency causes said membrane to resonate, and conductive means for applying said voltages across selected piezoelectric transducer to selectively bring membranes into resonance to selectively eject droplets perpendicular to the surface of said membranes through said one or more apertures.

2. A piezoelectrically actuated flextensional transducer as in claim 1 in which the membranes are silicon nitride.

3. A piezoelectrically actuated flextensional transducer as in claim 1 in which said membranes are polysilicon.

4. A piezoelectrically actuated flextensional transducer as in claim 1 in which said support structure is silicon oxide.

5. A piezoelectrically actuated flextensional transducer as in claim 1 in which said membranes are circular and said piezoelectric transducers are annular.

6. A piezoelectrically actuated flextensional transducer as in claim 1 in which the membranes merge to form a single membrane with multiple piezoelectric transducers.

7. A piezoelectrically actuated flextensional transducer as in claims 1, 2, 3, 4, or 5 in which the apertures are spaced apart a distance less than 100 $\mu$m.

8. A piezoelectrically actuated flextensional transducer as in claims 1, 2, 3, 4, or 5 in which the apertures are spaced apart a distance between 50 and 100 $\mu$m.

* * * * *